United States Patent
Xie et al.

(10) Patent No.: US 10,438,658 B2
(45) Date of Patent: Oct. 8, 2019

(54) REFRESH LOGIC TO REFRESH ONLY MEMORY CELLS HAVING A FIRST VALUE

(71) Applicant: INTEL CORPORATION, Santa Clara, CA (US)

(72) Inventors: Ningde Xie, Hillsboro, OR (US); Robert W. Faber, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/583,547

(22) Filed: Dec. 26, 2014

(65) Prior Publication Data

US 2016/0189774 A1    Jun. 30, 2016

(51) Int. Cl.
G11C 13/00 (2006.01)

(52) U.S. Cl.
CPC ...... *G11C 13/0033* (2013.01); *G11C 13/0004* (2013.01); *G11C 13/004* (2013.01); *G11C 13/0069* (2013.01)

(58) Field of Classification Search
CPC ........ G11C 13/0033; G11C 2013/0076; G11C 13/0004; G11C 11/40607; G11C 16/10
See application file for complete search history.

(56) References Cited

U.S. PATENT DOCUMENTS

| | | | |
|---|---|---|---|
| 7,385,868 B2* | 6/2008 | Moore | G11C 11/406 365/185.18 |
| 8,040,723 B2 | 10/2011 | Sheu et al. | |
| 8,216,862 B2 | 7/2012 | Kreupl et al. | |
| 8,355,291 B2 | 1/2013 | Kim et al. | |
| 8,605,531 B2 | 12/2013 | Kau | |
| 2004/0022085 A1 | 2/2004 | Parkinson et al. | |
| 2006/0158948 A1* | 7/2006 | Fuji | G11C 11/406 365/222 |
| 2007/0258306 A1 | 11/2007 | Riekels et al. | |
| 2009/0010048 A1* | 1/2009 | Fuji | G11C 11/406 365/163 |
| 2010/0321987 A1* | 12/2010 | Lung | G11C 13/0004 365/163 |
| 2011/0235409 A1 | 9/2011 | Kang et al. | |
| 2012/0063196 A1* | 3/2012 | Kim | G11C 13/0004 365/148 |
| 2012/0075924 A1* | 3/2012 | Kau | G11C 13/0004 365/163 |

(Continued)

OTHER PUBLICATIONS

Pangal et al., U.S. Appl. No. 14/038,165, filed Sep. 26, 2013.*

(Continued)

*Primary Examiner* — Mushfique Siddique
(74) *Attorney, Agent, or Firm* — Konrad Raynes Davda & Victor LLP; David W. Victor

(57) ABSTRACT

Provided is a non-volatile memory device comprising a plurality of memory cells and memory control logic that when executed performs operations comprising initiating a refresh operation; in response to the refresh operation, performing a read of the memory cells to read values of the memory cells; determining whether the read memory cells have a first value or a second value; and for the memory cells determined to have the first value, rewriting the determined first value to the memory cell, wherein the rewriting operation is not performed with respect to memory cells determined to have the second value.

22 Claims, 6 Drawing Sheets

(56) References Cited

U.S. PATENT DOCUMENTS

| | | | | |
|---|---|---|---|---|
| 2012/0144106 | A1* | 6/2012 | Bains | G11C 11/40611 711/106 |
| 2013/0336047 | A1 | 12/2013 | Hokenmaier | |
| 2013/0336048 | A1* | 12/2013 | Hokenmaier | G11C 13/0004 365/163 |
| 2014/0006696 | A1* | 1/2014 | Ramanujan | G11C 13/0004 711/103 |
| 2014/0115428 | A1 | 4/2014 | Fai | |
| 2014/0177355 | A1* | 6/2014 | Kim | G11C 13/0004 365/189.15 |
| 2014/0258804 | A1 | 9/2014 | Pangal et al. | |
| 2015/0052394 | A1* | 2/2015 | Sunwoo | G06F 11/10 714/16 |
| 2015/0089120 | A1* | 3/2015 | Pangal | G11C 13/0004 711/103 |
| 2015/0287455 | A1* | 10/2015 | Park | G11C 13/004 365/148 |
| 2016/0027508 | A1* | 1/2016 | Lee | G11C 13/0033 365/148 |
| 2016/0284399 | A1* | 9/2016 | Mantegazza | G11C 13/004 |

OTHER PUBLICATIONS

Kau, D., et al., "A Stackable Cross Point Phase Change Memory", In Proceedings of the 2009 IEEE International Electron Devices Meeting (IEDM), Dec. 2009, 4 pp.

Ou, E., "Array Architecture for a Nonvolatile 3-Dimensional Cross-Point Memory", Dissertation, Stanford University, Mar. 2010, 119 pp.

Wikipedia, "Phase-Change Memory", [online], Last Modified Dec. 9, 2014, [Retrieved Dec. 12, 2014], retrieved from the Internet at <URL: http://en.wikipedia.org/w/index.php?title=Phase-change_memory&oldid=637295404>, 10 pp.

Wikipedia, "Resistive Random-Access Memory", [online], Last Modified Nov. 23, 2014, [Retrieved Nov. 30, 2014], retrieved from the Internet at <URL: http://en.wikipedia.org/w/index.php?title=Resistive_random-access_memory&oldid=635087919>, 7 pp.

International Search Report and Written Opinion for International Application No. PCT/US2015/062793, dated Mar. 8, 2016, 11 pp.

Office Action 1 and Search Report for TW Application No. 104139145, dated Oct. 31, 2016, 8 pp. (w/ English Language Translation of Search Report).

Office Action 2 and Search Report for TW Application No. 104139145, dated Jun. 20, 2017, 11 pp. (w/ English Language Translation of Search Report).

International Preliminary Report on Patentability for International Application No. PCT/US2015/062793, dated Jul. 6, 2017, 8 pp.

Response to Office Action 2 for TW Application No. 104139145, dated Dec. 6, 2017, 55 pp. (w/ English Language Translation of Amended Specification).

* cited by examiner

REFRESH LOGIC TO REFRESH ONLY MEMORY CELLS HAVING A FIRST VALUE

TECHNICAL FIELD

Embodiments described herein generally relate to a non-volatile memory device.

BACKGROUND

Phase change memory is a type of non-volatile (NV) random-access (RAM) computer memory that works by changing the resistance across a dielectric solid-state material often referred to as a memristor. Phase change memory cells are programmed by applying either a SET voltage or a RESET voltage. The SET transitions cells from a high resistance state to a low resistance state and the RESET brings the cells from a low resistance state to a high resistance state.

BRIEF DESCRIPTION OF THE DRAWINGS

Embodiments are described by way of example, with reference to the accompanying drawings, which are not drawn to scale, in which like reference numerals refer to similar elements.

DESCRIPTION OF EMBODIMENTS

The resistance of the cells in a phase change memory can experience a drift toward higher resistance levels. For this reason, the resistance settings in the memory cells must be refreshed to avoid read errors that may be introduced by the drift effect.

Figure 1:
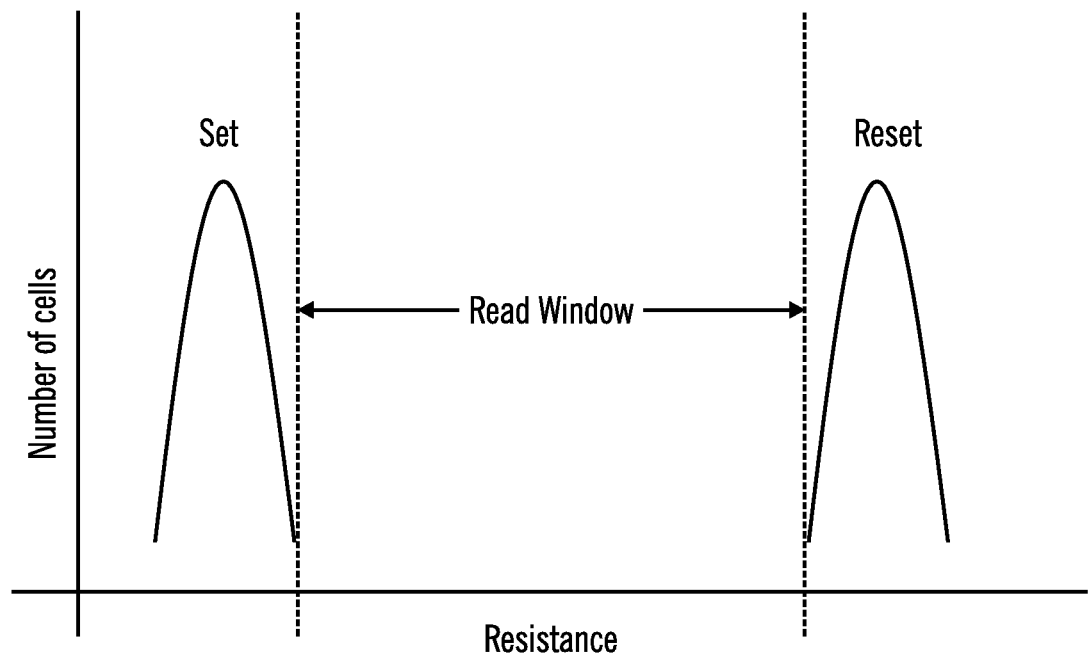
FIG. 1 illustrates distributions of the low and high resistance states of memory cells after the data has been refreshed.

Current phase change memories having resistance change memory cells may experience a drift in the resistance in the upward direction. FIG. 1 illustrates a distribution of the resistance after the values are initially set, where the SET lower resistance state cells have a distribution in the lower range and the RESET higher resistance state cells have a distribution in the higher range. The read window shows the difference between the distributions. The greater the read window the less likelihood of read errors because of the greater ability to distinguish the resistance state of the low resistance and high resistance states.

Figure 2:
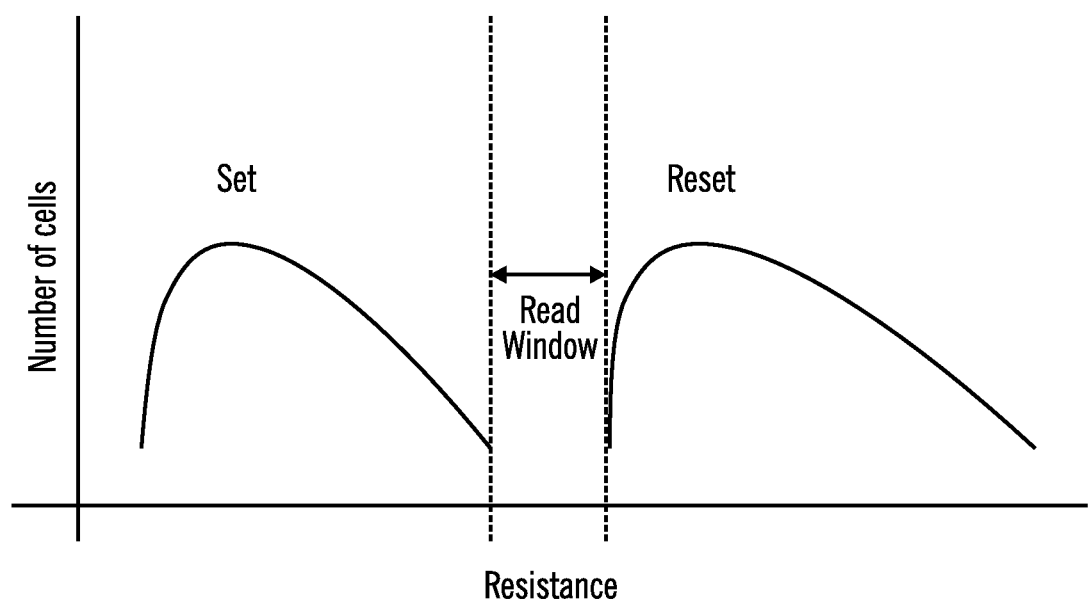
FIG. 2 illustrates distributions of the high and low resistance states of memory cells that drift upward over time.

However, over time, the resistance of the cells for both high and low resistances drift in the upward voltage direction as shown in FIG. 2. FIG. 2 shows that the drift reduces the read window from its length in FIG. 1, as the right tail of the distribution of the lower resistance state cells approaches the left tail of the distribution of the high resistance cells. This reduction in the read window increases the likelihood of read errors in determining the low resistance state of cells at the right of the drifted distribution.

To address the concern of drift, memory devices need to refresh the memory cells. Many memory devices perform a refresh by refreshing the values for the memory cells for all of the values, i.e., regardless of whether the cell that is read has a first state or second state, for example, one state corresponding to a SET voltage (low resistance state), the other state corresponding to a RESET voltage (high resistance state).

Described embodiments seek to reduce the energy consumption required for the refresh operation by only refreshing the cells having the lower resistance state. For memory devices experiencing an upward drive in the voltage, the high resistance cells do not need to be reset because high resistance cells drifting upward in resistance have even a lower read error rate. Thus, described embodiments optimize the refresh process and reduce memory consumption by reducing the number of writes required for the refresh by limiting the write operation to only the cells having the lower resistance state.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

Figure 3:
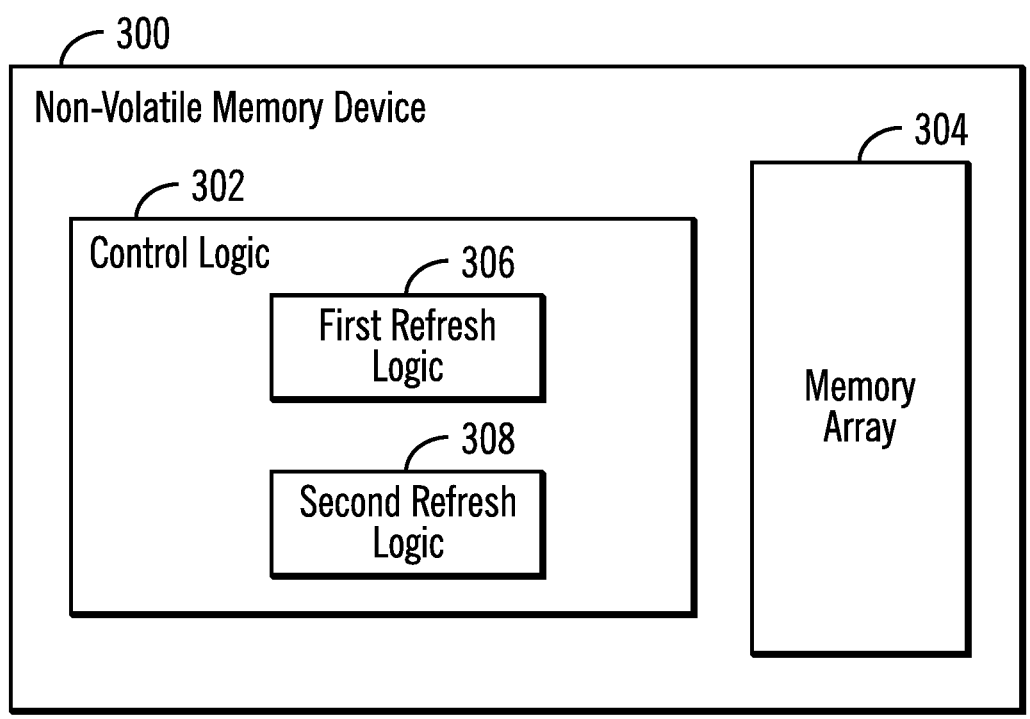
FIG. 3 illustrates an embodiment of a non-volatile storage device, which may comprise a memory or storage device.

FIG. 3 illustrates an embodiment of a non-volatile memory device 300 having a controller 302 and a memory array 304 of non-volatile memory cells. The non-volatile memory device 300 may function as both a memory device and/or a storage device in a computing system, and may be used to perform the role of volatile memory devices and disk drives in a computing system. In an embodiment, the non-volatile memory device 300 may be a solid state drive (SSD). The controller 302 includes first refresh logic 306 to drive periodic refresh operations at a first refresh rate and second refresh logic 308 to drive a different type of refresh operations at second refresh rate, where the second refresh rate occurs at longer interval than the first refresh rate. The controller 302 includes various other logic to perform additional memory management operations.

In certain embodiments, the memory array 304 may comprise phase change memory cells that are set to a low resistance state value to indicate a first value, such as a logical zero, and a high resistance state to indicate a second value, such as a logical one. The initial distribution of the memory cells in the low and high resistance states may be as shown in FIG. 1. In further embodiments, the distribution of the resistance of the memory cells have a tendency to drift toward a higher voltage, such as shown in FIG. 2.

The non-volatile memory device 300 may comprise any non-volatile memory that has memory cells that have a tendency to drift toward a higher resistance value, such as a phase change memory or other similar devices. The cells in the memory array 304 may be arranged in a Three Dimensional (3D) multi-layer cross point memory array structure.

Figure 4:
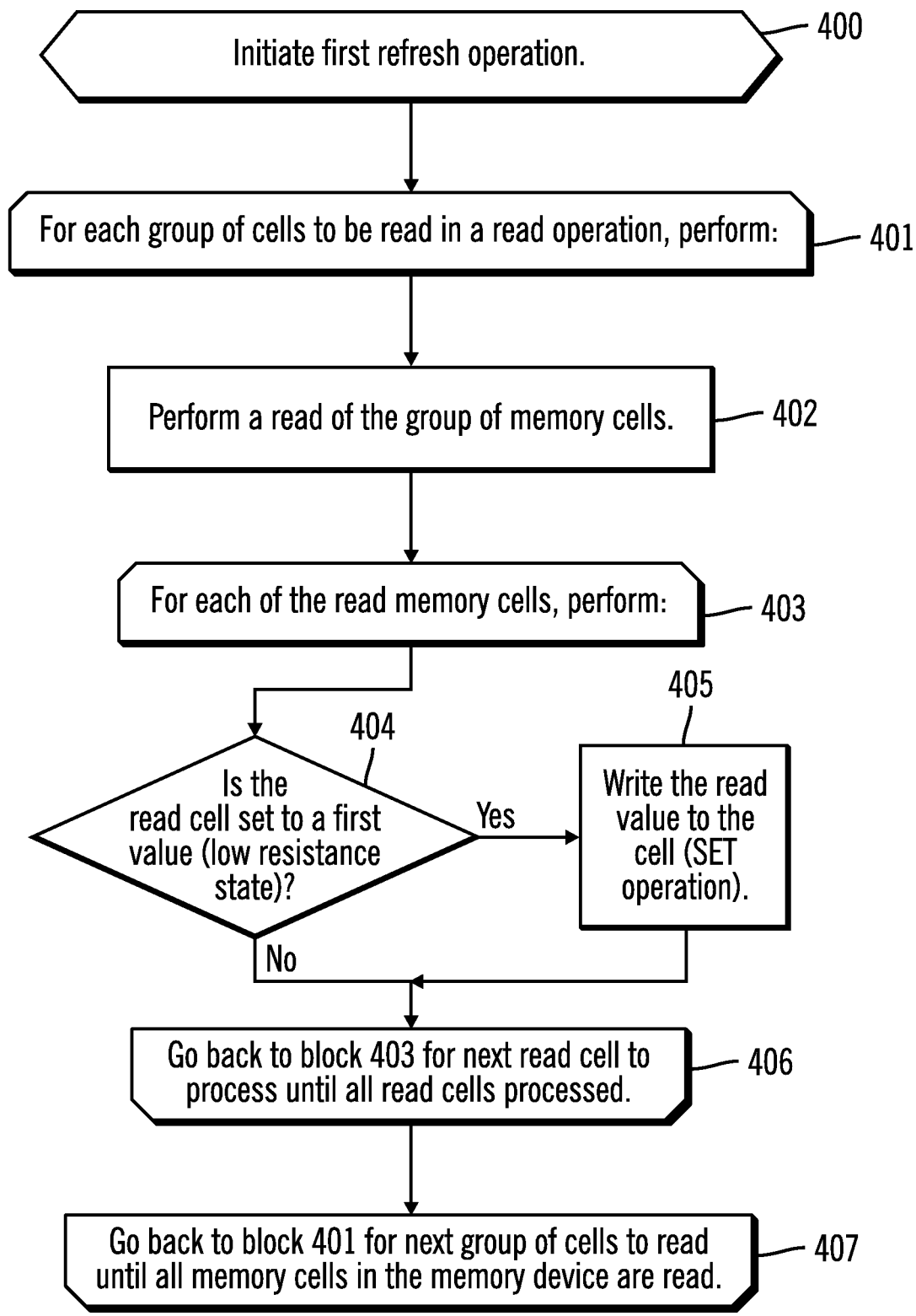
FIG. 4 illustrates an embodiment of operations to refresh memory cells as part of a first refresh logic.

FIG. 4 illustrates an embodiment of operations performed by the first refresh logic 306 to SET the values for the memory cells having the low resistance state. The first refresh logic 306 may be initiated periodically at a rate that is determined to avoid the drift of the distribution of the low resistance state memory cells from reducing the size of the read window to an extent that results in an unacceptable level of read errors resulting from the reduction in the read window as shown in FIG. 2. Thus, the first refresh logic 306 refresh rate is based on a rate needed to reset the low resistance state memory cells before the read window shrinks to a level that starts resulting in a high level of read errors of the memory cells set to the low resistance state.

Upon initiating (at block 400) the refresh operation, the first refresh logic 306 performs a loop of operations at blocks 401 through 407 to read a group of memory cells until all memory cells in the memory array 304 have been read. At block 402, a group of memory cells in the memory array 304 is read. In a 3D cross point memory array structure embodiment, a group of memory cells is read by a single read operation ($V_{READ}$) that drives a read current on wordline to read the cells on the bitlines that cross the read wordline. In this way groups of cells that are read comprise the cells read on the wordline. In alternative embodiments, other techniques may be used to read a group of cells in the memory array 304. With described embodiments, the first refresh logic 306 is enabled to selectively write the SET state to the memory cells without writing the cells in the RESET state.

A loop of operations is then performed at blocks 403 through 406 for each of the read memory cells in the group. If (at block 404) the read cell is at a first value (such as a low resistance state), then the first refresh logic 306 writes the read value to the cell. In Resistive Random Access Memory (RRAM) embodiments, the SET operation may be used to reset the cell read to the low resistance state. If (at block 404) the read cell has the second value (such as a high resistance state), then that cell is not rewritten and control proceeds to block 406 to read a next cell in the group.

Figure 5:
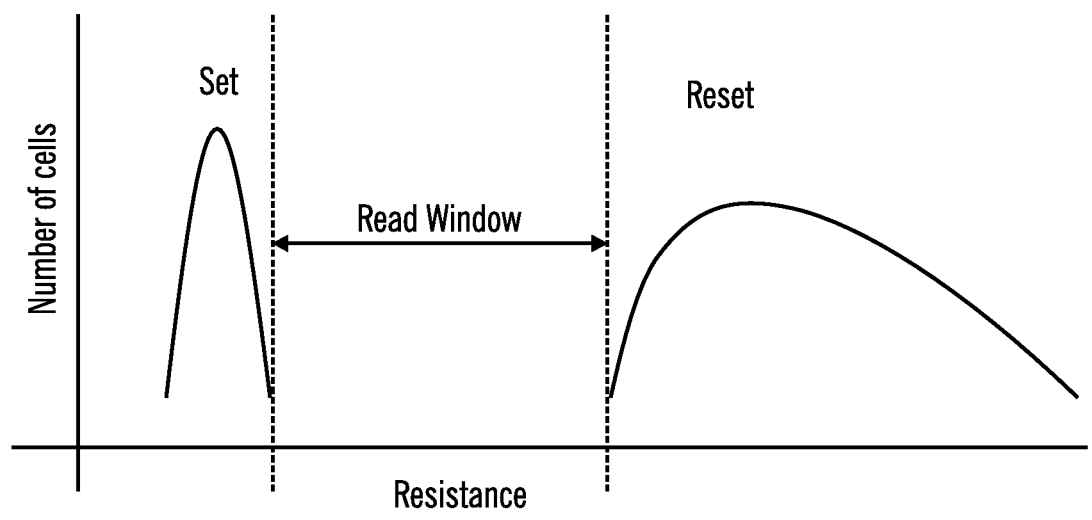
FIG. 5 illustrates a distribution of low and high resistance states of memory cells after performing the operations of FIG. 4.

With the operations of FIG. 4, only cells having the low resistance state are rewritten or refreshed, while cells having the high resistance state are unchanged. The execution of the first refresh logic 306 results in the cell distribution shown in FIG. 5 where the low resistance state cells distribution is returned to the initial distribution and the read window is returned to the initial read window shown in FIG. 1. However, as a result of the first refresh logic 306, the high resistance state cells are allowed to continue to drift toward a higher resistance value because their drift does not affect the read window and read error rate.

The operations of FIG. 4 conserve energy by only performing the write operation with respect to low resistance state cells to avoid expending energy to also refresh the high resistance state cells. In embodiments, where there are generally an equal number of cells having the high and low resistance states, the embodiments of FIG. 4 will reduce, for the stated condition (equal high and low), the number of refresh operations by 50% or more. Further, the operations during a refresh for high and low resistance states consumes more energy and takes longer time than regular write operations. Reducing refresh operations by 50% could result in a reduction in energy consumption on the order of 50% or less. For memory devices 300 with an equal number of cells having high and low resistance states (as, for example, systems with randomized data), and for technologies with equal SET and RESET energy consumption, reducing the number of refresh operations by 50% will reduce the total refresh energy consumption by 50%. Actual energy consumption is a function of the relative energy consumption of SET and RESET refresh operations.

Figure 6:
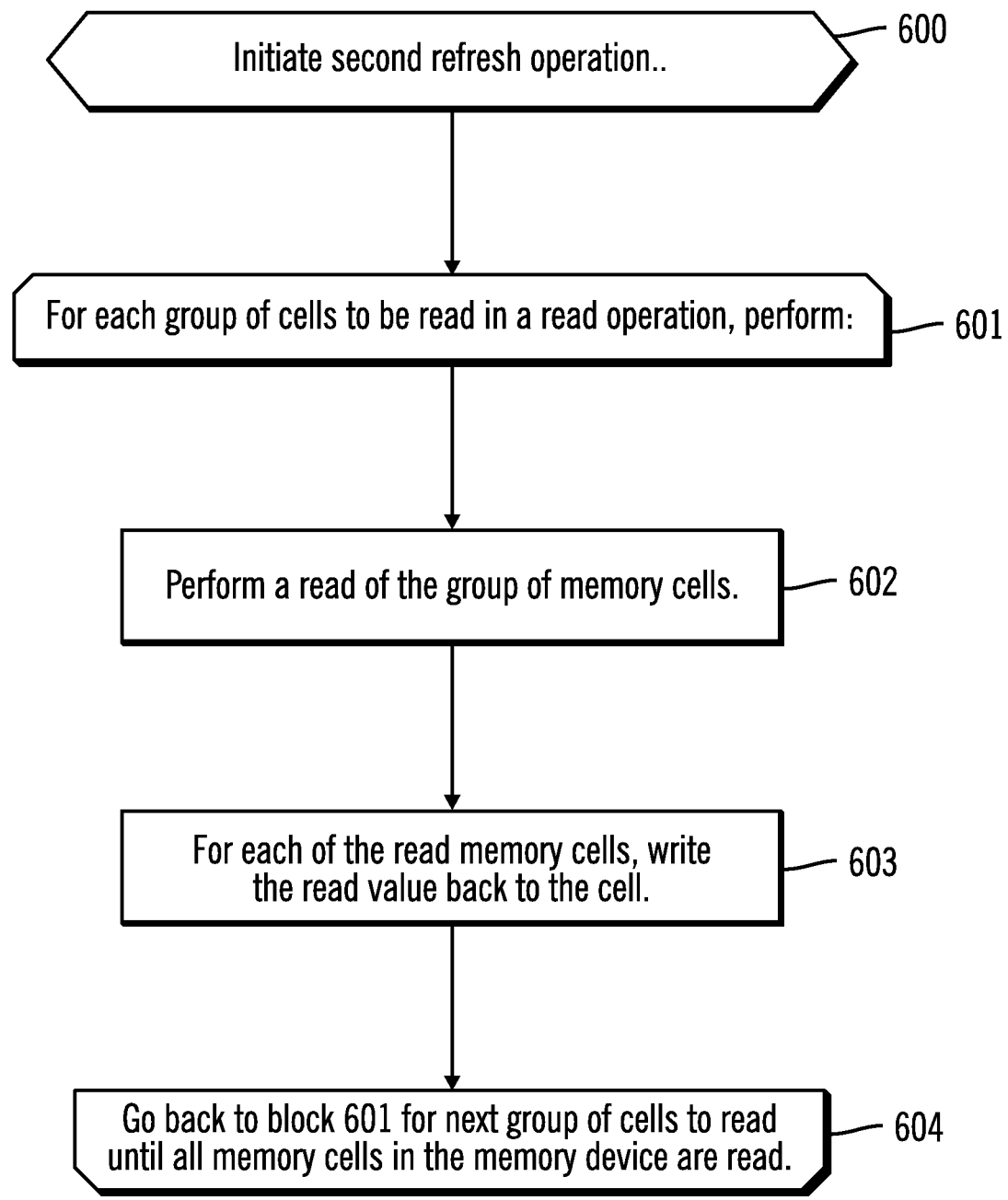
FIG. 6 illustrates an embodiment of operations to refresh memory cells as part of second refresh logic.

FIG. 6 illustrates an embodiment of operations performed by the second refresh logic 308 at a refresh rate having a longer interval than the first refresh logic 306 refresh rate. The second refresh logic 308 is intended to be performed to reset the high resistance state cells to avoid the occurrence of a significant drift of the high resistance state cells over an extended time to a resistance level where they cannot be RESET to the high resistance state as shown in FIG. 1. Thus, the refresh rate for the second refresh logic 308 is the extended time needed to reset the high resistance state cells before their resistance drifts to a point where they cannot be reset, which can be several years.

Upon initiating (at block 600) the second refresh operation, the second refresh logic 308 performs a loop of operations at blocks 601-604 to read a group of memory cells until all memory cells in the memory array 304 have been read. At block 602, a group of memory cells in the memory array 304 is read. As mentioned, in a 3D cross point memory array structure embodiment, a group of memory cells is ready by a single read operation ($V_{READ}$). For each of the read memory cells, the second refresh logic 308 writes the read value back to the memory cell. If a low resistance state is read, then the second refresh logic 308 performs a SET operation to write back the low resistance state. If a high resistance state is read, then the second refresh logic 308 performs a RESET operation to set the cell to the high resistance state. The result of the operations of FIG. 6 is to return the memory cells to the initial distribution and initial read window shown in FIG. 1, and to reset the high resistance state cells so that they do not drift to a resistance level at which they cannot be reset.

In an alternative embodiment, the second refresh logic 308 may only write the read value if a high resistance state value is read, and not write back the low resistance state if the low resistance state is read. This conserves energy by only writing those cells that have the high resistance state. The low resistance state memory cells are SET as part of the more frequently occurring first refresh logic 306.

Figure 7:
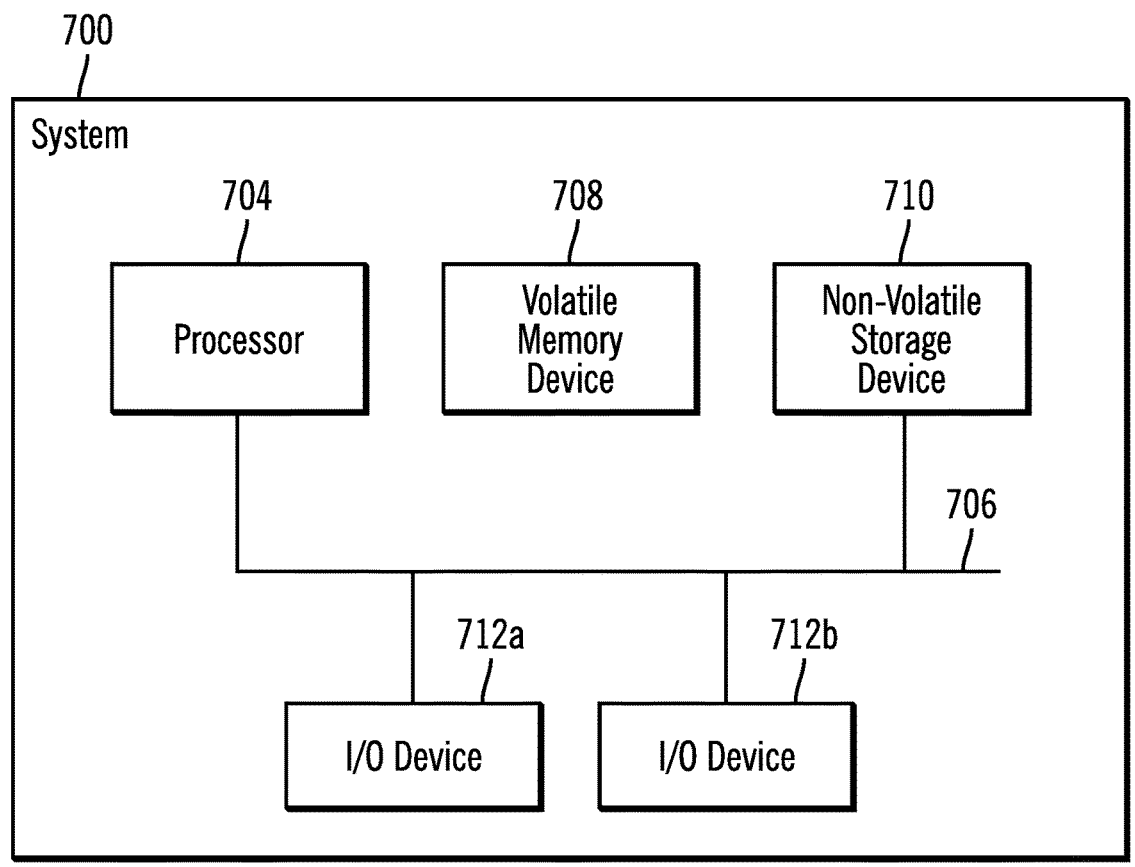
FIG. 7 illustrates a system in which the memory device of FIG. 3 may be deployed.

FIG. 7 illustrates an embodiment of a system 700 in which the non-volatile memory device 300 may be deployed as the volatile memory device 708 and/or a non-volatile memory device 710. The system includes a processor 700 that communicates over a bus 706 with a volatile memory device 708 in which programs, operands and parameters being executed are cached, and a non-volatile storage device 710. The processor 704 may also communicate with Input/Output (I/O) devices 712a, 712b, which may comprise input devices, display devices, graphics cards, ports, network interfaces, etc. The non-volatile storage device 710 may be inserted in a memory slot on the system 700 motherboard, mounted on the system 700 mother board, in an external memory device or accessible over a network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

EXAMPLES

The following examples pertain to further embodiments.

Example 1 is an apparatus comprising a plurality of non-volatile memory cells; and memory control logic that when executed performs operations, the operations comprising: initiating a refresh operation; in response to the refresh operation, performing a read of the non-volatile memory cells to read values of the memory cells; determining whether the read memory cells have a first value or a second value; and for the memory cells determined to have the first value, rewriting the determined first value to the memory cell, wherein the rewriting operation is not performed with respect to memory cells determined to have the second value.

In Example 2, the subject matter of Example 1 can optionally include that the first value is initially set to a low resistance state and wherein the second value is initially set to a high resistance state, wherein the memory cells exhibit a characteristic to drift upward toward a higher resistance from their current resistance over time.

In Example 3, the subject matter of Example 1 and 2 can optionally include that prior to the drift, a read window between the distribution of the cells set to the low resistance state and the distribution of the cells set to the high resistance state has an initial resistance distance, wherein the drift causes the read window to shrink by having the resistance distribution of the cells initially set to the low resistance state drift toward the resistance distribution of the cells initially set to the high resistance state, and wherein the refresh operation changes the distribution of the cells in the low resistance state to substantially returns the read window to the initial resistance distance.

In Example 4, the subject matter of Examples 1-3 can optionally include that the plurality of memory cells are arranged in a 3D multi-layer cross point memory array.

In Example 5, the subject matter of Example 1-4 can optionally include that the memory cells comprise phase change memory cells, wherein the first value is represented by a low resistance state and the second value is represented by a high resistance state.

In Example 6, the subject matter of Examples 1-5 can optionally include that the refresh operation comprises a first refresh operation performed periodically at a first time interval, wherein the operations further comprise: initiating a second refresh operation periodically at a second time interval; in response to the second refresh operation, performing a read of the memory cells to read values of the memory cells; and for the memory cells having the second value, writing the second value back to the memory cell.

In Example 7, the subject matter of Examples 2-6 can optionally include that the operations in response to the second refresh operation further comprise: for each of the memory cells having the first value, writing the first value back to the memory cell.

In Example 8, the subject matter of Examples 2-7 can optionally include that the second time interval is greater than the first time interval.

In Example 9, the subject matter of Examples 2-8 can optionally include that the memory cells in the first value are in a SET state and wherein the memory cells having the second value are in a RESET state, wherein the control logic is enabled to selectively write the SET state to the memory cells without writing the cells in the RESET state.

Example 10 is a method for refreshing a plurality of memory cells in a non-volatile memory device, comprising: initiating a refresh operation; in response to the refresh operation, performing a read of the memory cells to read values of the memory cells; determining whether the read memory cells have a first value or a second value; and for the memory cells determined to have the first value, rewriting the determined first value to the memory cell, wherein the rewriting operation is not performed with respect to memory cells determined to have the second value.

In Example 11, the subject matter of Example 10 can optionally include that the first value is initially set to a low resistance state and wherein the second value is initially set to a high resistance state, wherein the memory cells exhibit a characteristic to drift upward toward a higher resistance from their current resistance over time.

In Example 12, the subject matter of Examples 10 and 11 can optionally include that prior to the drift, a read window between the distribution of the cells set to the low resistance state and the distribution of the cells set to the high resistance state has an initial resistance distance, wherein the drift causes the read window to shrink by having the resistance distribution of the cells initially set to the low resistance state drift toward the resistance distribution of the cells initially set to the high resistance state, and wherein the refresh operation changes the distribution of the cells in the low resistance state to substantially returns the read window to the initial resistance distance.

In Example 13, the subject matter of Examples 10-12 can optionally include that the plurality of memory cells are arranged in a 3D multi-layer cross point memory array.

In Example 14, the subject matter of Examples 10-13 can optionally include that the memory cells comprise phase change memory cells, wherein the first value is represented by a low resistance state and the second value is represented by a high resistance state.

In Example 15, the subject matter of Examples 10-14 can optionally include that the refresh operation comprises a first refresh operation performed periodically at a first time interval, further comprising: initiating a second refresh operation periodically at a second time interval; in response to the second refresh operation, performing a read of the memory cells to read values of the memory cells; and for the memory cells having the second value, writing the second value back to the memory cell.

In Example 16, the subject matter of Examples 10-15 can optionally include that for each of the memory cells having the first value, writing during the second refresh operation the first value back to the memory cell.

In Example 17, the subject matter of Examples 10-16 can optionally include that the second time interval is greater than the first time interval.

In Example 18, the subject matter of Examples 10-17 can optionally include that the memory cells in the first value are in a SET state and wherein the memory cells having the second value are in a RESET state, wherein the control logic is enabled to selectively write the SET state to the memory cells without writing the cells in the RESET state.

In Example 19, the subject matter of Example 10 can optionally include at least one step of:

(1) wherein the first value is initially set to a low resistance state and wherein the second value is initially set to a high resistance state, wherein the memory cells exhibit a characteristic to drift upward toward a higher resistance from their current resistance over time; and/or (2) wherein prior to the drift, a read window between the distribution of the cells set to the low resistance state and the distribution of the cells set to the high resistance state has an initial resistance distance, wherein the drift causes the read window to shrink by having the resistance distribution of the cells initially set to the low resistance state drift toward the resistance distribution of the cells initially set to the high resistance state, and wherein the refresh operation changes the distribution of the cells in the low resistance state to substantially returns the read window to the initial resistance distance; and/or (3) wherein the plurality of memory cells are arranged in a 3D multi-layer cross point memory array; and/or (4) wherein the memory cells comprise phase change memory cells, wherein the first value is represented by a low resistance state and the second value is represented by a high resistance state; and/or (5) wherein the refresh operation comprises a first refresh operation performed periodically at a first time interval, further comprising: initiating a second refresh operation periodically at a second time interval; in response to the second refresh operation, performing a read of the memory cells to read values of the memory cells; and for the memory cells having the second value, writing the second value back to the memory cell; and/or (6) for each of the memory cells having the first value, writing during the second refresh operation the first value back to the memory cell; and/or (7) wherein the second time interval is greater than the first time interval; and/or (8) wherein the memory cells in the first value are in a SET state and wherein the memory cells having the second value are in a RESET state, wherein the control logic is enabled to selectively write the SET state to the memory cells without writing the cells in the RESET state.

Example 20 is an apparatus comprising means to perform a method as claimed in any preceding claim.

Example 21 is a system, comprising: a processor; a bus interface coupled to the processor; and non-volatile memory device coupled to the bus interface to which the processor performs Input/Output operations, comprising: a plurality of memory cells; and memory control logic that when executed performs operations, the operations comprising: initiating a refresh operation; in response to the refresh operation, performing a read of the memory cells to read values of the memory cells; determining whether the read memory cells have a first value or a second value; and for the memory cells determined to have the first value, rewriting the determined first value to the memory cell, wherein the rewriting operation is not performed with respect to memory cells determined to have the second value.

In Example 22, the subject matter of Example 21 can optionally include that the first value is initially set to a low resistance state and wherein the second value is initially set to a high resistance state, wherein the memory cells exhibit a characteristic to drift upward toward a higher resistance from their current resistance over time.

In Example 23, the subject matter of Examples 21 and 22 can optionally include that prior to the drift, a read window between the distribution of the cells set to the low resistance state and the distribution of the cells set to the high resistance state has an initial resistance distance, wherein the drift causes the read window to shrink by having the resistance distribution of the cells initially set to the low resistance state drift toward the resistance distribution of the cells initially set to the high resistance state, and wherein the refresh operation changes the distribution of the cells in the low resistance state to substantially returns the read window to the initial resistance distance.

In Example 24, the subject matter of Examples 21-23 can optionally include that the plurality of memory cells are arranged in a 3D multi-layer cross point memory array.

In Example 25, the subject matter of Examples 21-24 can optionally include that the memory cells comprise phase change memory cells, wherein the first value is represented by a low resistance state and the second value is represented by a high resistance state.

In Example 26, the subject matter of Examples 21-25 can optionally include that the refresh operation comprises a first refresh operation performed periodically at a first time interval, wherein the operations further comprise: initiating a second refresh operation periodically at a second time interval; in response to the second refresh operation, performing a read of the memory cells to read values of the memory cells; and for the memory cells having the second value, writing the second value back to the memory cell.

In Example 27, the subject matter of Examples 21-26 can optionally include that the memory cells in the first value are in a SET state and wherein the memory cells having the second value are in a RESET state, wherein the control logic is enabled to selectively write the SET state to the memory cells without writing the cells in the RESET state.

Example 28 is an apparatus for refreshing a plurality of memory cells in a non-volatile memory device, comprising: means for initiating a refresh operation; means for performing a read of the memory cells to read values of the memory cells in response to the refresh operation; means for determining whether the read memory cells have a first value or a second value; and means for rewriting the determined first value to the memory cell, wherein the rewriting operation is not performed with respect to memory cells determined to have the second value for the memory cells determined to have the first value.

In Example 29, the subject matter of Example 28 can optionally include that the first value is initially set to a low resistance state and wherein the second value is initially set to a high resistance state, wherein the memory cells exhibit a characteristic to drift upward toward a higher resistance from their current resistance over time.

In Example 30, the subject matter of Examples 28 and 29 can optionally include that the refresh operation comprises a first refresh operation performed periodically at a first time interval, further comprising: means for initiating a second refresh operation periodically at a second time interval; means for performing a read of the memory cells to read values of the memory cells in response to the second refresh operation; and means for writing the second value back to the memory cell for the memory cells having the second value.

Example 23 is a machine-readable storage including machine-readable instructions, when executed, to implement a method or realize an apparatus or system as claimed in any preceding claim.

What is claimed is:

1. An apparatus to interact with a plurality of memory cells in a memory device, comprising:
a memory controller to interact with the plurality of memory cells set to a high resistance state or a low resistance state, wherein the plurality of the memory cells set exhibit a characteristic to drift upward toward a higher resistance from their current resistance over time, and having:
refresh logic initiated at a refresh rate to
rewrite the low resistance state to only memory cells of the plurality of memory cells having the low resistance state, wherein the rewrite is not initiated with respect to the memory cells determined to have the high resistance state, wherein the memory cells having the high resistance state drift upward toward higher resistance values while the low resistance state memory cells are returned to an initial distribution by the refresh logic.

2. The apparatus of claim 1, wherein prior to the drift, a read window between a first distribution of low resistance state memory cells of the plurality of memory cells set to the low resistance state and a second distribution of high resistance state memory cells of the plurality of memory cells set to the high resistance state has an initial resistance distance, wherein the drift causes the read window to shrink by having the first distribution of the low resistance state memory cells drift toward the second distribution of the high resistance state memory cells initially set to the high resistance state, and wherein the refresh logic changes the first distribution of the low resistance state memory cells resulting in the read window expanding toward the initial resistance distance.

3. The apparatus of claim 1, wherein the plurality of memory cells are non-volatile memory cells arranged in a 3D multi-layer crosspoint memory array.

4. The apparatus of claim 1, wherein the plurality of memory cells comprise phase change memory cells.

5. The apparatus of claim 1, wherein the refresh logic comprises first refresh logic and the refresh rate comprises a first refresh rate, wherein the memory controller further comprises:
second refresh logic initiated at a second refresh rate to write the high resistance state to memory cells of the plurality of memory cells having the high resistance state.

6. An apparatus to interact with a plurality of memory cells in a memory device, comprising:
a memory controller to interact with the plurality of memory cells set to a high resistance state or a low resistance state, wherein the plurality of the memory cells set exhibit a characteristic to drift upward toward a higher resistance from their current resistance over time, and having:
first refresh logic initiated at a first refresh rate to
rewrite the low resistance state to memory cells of the plurality of memory cells having the low resistance state, wherein the rewrite is not initiated with respect to the memory cells determined to have the high resistance state;
second refresh logic initiated at a second refresh rate to write the high resistance state to memory cells of the plurality of memory cells having the high resistance state; and
for each of the plurality of the memory cells having the low resistance state, write the low resistance state back to the memory cells having the low resistance state.

7. An apparatus to interact with a plurality of memory cells in a memory device, comprising:
a memory controller having to interact with the plurality of memory cells set to a high resistance state or a low resistance state, wherein the plurality of the memory cells set exhibit a characteristic to drift upward toward a higher resistance from their current resistance over time, and refresh logic to:
initiate a first refresh operation periodically at a first time interval;
in response to the first refresh operation, rewrite the low resistance state to memory cells of the plurality of memory cells having the low resistance state, wherein the rewrite is not initiated with respect to the memory cells determined to have the high resistance state;
initiate a second refresh operation periodically at a second time interval, wherein the second time interval is greater than the first time interval; and
in response to the second refresh operation, write the high resistance state to memory cells of the plurality of memory cells having the high resistance state.

8. The apparatus of claim 1, wherein the memory cells having the low resistance state are in a SET state and wherein the memory cells having the high resistance state are in a RESET state, wherein the first refresh logic is to selectively write the SET state to the memory cells having the SET state without writing the memory cells in the RESET state.

9. A method for refreshing a plurality of memory cells in a memory device, comprising:
interacting with the plurality of memory cells set to a high resistance state or a low resistance state, wherein the plurality of the memory cells set exhibit a characteristic to drift upward toward a higher resistance from their current resistance over time; and
initiating, with refresh logic, a refresh operation at a refresh rate to rewrite the low resistance state to only memory cells of the plurality of memory cells having the low resistance state, wherein the rewriting is not initiated with respect to memory cells determined to have the high resistance state, wherein the memory cells having the high resistance state drift upward toward higher resistance values while the low resistance state memory cells are returned to an initial distribution by the refresh logic.

10. The method of claim 9, wherein prior to the drift, a read window between a first distribution of low resistance state memory cells of the plurality of the memory cells set to the low resistance state and a second distribution of high resistance state memory cells of the plurality of the memory cells set to the high resistance state has an initial resistance distance, wherein the drift causes the read window to shrink by having the first distribution of the low resistance state memory cells drift toward the second distribution of the high resistance state memory cells initially set to the high resistance state, and wherein the refresh operation changes the first distribution of the low resistance state memory cells resulting in the read window expanding toward the initial resistance distance.

11. The method of claim 9, wherein the plurality of memory cells are non-volatile memory cells arranged in a 3D multi-layer cross point memory array.

12. The method of claim 9, wherein the plurality of memory cells comprise phase change memory cells.

13. The method of claim 9, wherein the refresh logic comprises first refresh logic and the refresh rate comprises a first refresh rate, further comprising:
initiating, with second refresh logic, a second refresh operation periodically at a second refresh rate different from the first refresh rate to write the high resistance state to memory cells of the plurality of memory cells having the high resistance state.

14. A method for refreshing a plurality of memory cells in a memory device, comprising:
interacting with the plurality of memory cells set to a high resistance state or a low resistance state, wherein the plurality of the memory cells set exhibit a characteristic to drift upward toward a higher resistance from their current resistance over time;
initiating, with first refresh logic, a first refresh operation at a first refresh rate to rewrite the low resistance state to memory cells of the plurality of memory cells having the low resistance state, wherein the rewriting is not initiated with respect to memory cells determined to have the high resistance state;
initiating, with second refresh logic, a second refresh operation periodically at a second refresh rate different from the first refresh rate to write the high resistance state to memory cells of the plurality of memory cells having the high resistance state; and
for each of the memory cells having the low resistance state, writing, by the second refresh logic, during the second refresh operation the low resistance state back to the memory cells having the low resistance state.

15. A method for refreshing a plurality of memory cells in a memory device, comprising:
interacting with the plurality of memory cells set to a high resistance state or a low resistance state, wherein the plurality of the memory cells set exhibit a characteristic to drift upward toward a higher resistance from their current resistance over time; and
initiating a first refresh operation periodically at a first time interval rewriting the low resistance state to memory cells of the plurality of memory cells having the low resistance state, wherein the rewriting is not initiated with respect to the memory cells determined to have the high resistance state, wherein the memory cells having the high resistance state drift upward toward higher resistance values while the low resistance state memory cells are returned to an initial distribution by the first refresh operation initiating a second refresh operation periodically at a second time interval,
wherein the second time interval is greater than the first time interval, to write the high resistance state to memory cells of the plurality of memory cells having the high resistance state.

16. The method of claim 9, wherein the memory cells having the low resistance state are in a SET state and wherein the memory cells having the high resistance state are in a RESET state, wherein the SET state is written to the memory cells having the SET state without writing the memory cells in the RESET state.

17. A system, comprising:
a processor;
a bus interface coupled to the processor; and
a memory device coupled to the bus interface to which the processor performs Input/Output operations, comprising:
a plurality of memory cells set to a high resistance state or a low resistance state, wherein the plurality of the memory cells set exhibit a characteristic to drift upward toward a higher resistance from their current resistance over time; and
a memory controller having:
refresh logic initiated at a refresh rate to
rewrite the low resistance state to memory cells of the plurality of memory cells having the low resistance state, wherein the rewrite is not initiated with respect to the memory cells determined to have the high resistance state, wherein the memory cells having the high resistance state drift upward toward higher resistance values while the low resistance state memory cells are returned to an initial distribution by the refresh logic.

18. The system of claim 17, wherein prior to the drift, a read window between a first distribution of low resistance state memory cells of the plurality of memory cells set to the low resistance state and a second distribution of high resistance state memory cells of the plurality of memory cells set to the high resistance state has an initial resistance distance, wherein the drift causes the read window to shrink by having the first distribution of the low resistance state memory cells drift toward the second distribution of the high resistance state memory cells initially set to the high resistance state, and wherein the refresh logic changes the first distribution resulting in the read window expanding toward the initial resistance distance.

19. The system of claim 17, wherein the plurality of the memory cells are non-volatile memory cells arranged in a 3D multi-layer cross point memory array.

20. The system of claim 17, wherein the plurality of the memory cells comprise phase change memory cells.

21. The system of claim 17, wherein the memory cells having the low resistance state are in a SET state and wherein the memory cells having the high resistance state are in a RESET state, wherein the refresh logic is to selectively write the SET state to the memory cells having the SET state without writing the memory cells in the RESET state.

22. The system of claim 17, wherein the refresh logic comprises first refresh logic and the refresh rate comprises a first refresh rate, wherein the memory controller further comprises:
second refresh logic initiated at a second refresh rate to write the high resistance state to memory cells of the plurality of memory cells having the high resistance state.

* * * * *